(12) United States Patent
Ling et al.

(10) Patent No.: US 8,272,277 B2
(45) Date of Patent: Sep. 25, 2012

(54) SENSOR FOR MEASURING STRESSES INCLUDING A LAYER OF A MAGNETOELASTIC MATERIAL AND A METHOD FOR PRODUCING THE LAYER

(75) Inventors: Hans Ling, Spånga (SE); Andrius Miniotas, Västerås (SE)

(73) Assignee: ABB AB (SE)

( * ) Notice: Subject to any disclaimer, the term of this patent is extended or adjusted under 35 U.S.C. 154(b) by 0 days.

(21) Appl. No.: 13/072,121

(22) Filed: Mar. 25, 2011

(65) Prior Publication Data

US 2011/0167929 A1 Jul. 14, 2011

Related U.S. Application Data

(63) Continuation of application No. PCT/EP2009/060721, filed on Aug. 19, 2009.

(30) Foreign Application Priority Data

Sep. 25, 2008 (EP) .................................. 08165077

(51) Int. Cl.
*G01L 3/02* (2006.01)

(52) U.S. Cl. ............................ 73/862.333; 73/862.331

(58) Field of Classification Search .................. 73/862.331–862.333
See application file for complete search history.

(56) References Cited

U.S. PATENT DOCUMENTS

| | | | | |
|---|---|---|---|---|
| 4,319,188 A | * | 3/1982 | Ito et al. | 324/173 |
| 5,297,044 A | * | 3/1994 | Sakaki et al. | 702/43 |
| 5,585,574 A | * | 12/1996 | Sugihara et al. | 73/862.334 |
| 6,465,039 B1 | | 10/2002 | Pinkerton et al. | |
| 2004/0058064 A1 | | 3/2004 | Fuller et al. | |
| 2004/0239325 A1 | * | 12/2004 | Hardy et al. | 324/318 |

FOREIGN PATENT DOCUMENTS

| | | |
|---|---|---|
| EP | 0309979 A1 | 4/1989 |
| EP | 0609463 A1 | 8/1994 |
| JP | 10260093 A | 9/1998 |
| JP | 11326081 A | 11/1999 |

(Continued)

OTHER PUBLICATIONS

European Search Report; Application No. EP 08 16 5077; Feb. 20, 2009; 6 pages.

(Continued)

*Primary Examiner* — Max Noori
(74) *Attorney, Agent, or Firm* — St. Onge Steward Johnston & Reens LLC (57) ABSTRACT

A sensor for measuring stresses induced by a force applied to a load-carrying member, including a layer of a magnetoelastic material formed on the load-carrying member is provided. The layer comprises a first phase with an average grain size below 100 nm and a first chemical composition, and a second phase of a distinctly different chemical composition, the first phase being divided by the second phase into regions having an average size in the range of 100-10,000 nm. A method for producing such a layer, including accelerating particles of a soft magnetic and magnetoelastic material having an average size in the range of 10-50 μm towards the surface of the load-carrying member at a velocity of at least 300 m/s such that the average temperature of the accelerated particles is not higher than 500° C. above the melting temperature of the magnetoelastic material, but not lower than 500° C. below the melting temperature.

10 Claims, 3 Drawing Sheets

FOREIGN PATENT DOCUMENTS

| | | |
|---|---|---|
| JP | 2001041833 A | 2/2001 |
| JP | 2004027289 A | 1/2004 |
| WO | 0144770 A1 | 6/2001 |
| WO | 2006023450 A2 | 3/2006 |
| WO | 2007106024 A1 | 9/2007 |

OTHER PUBLICATIONS

Cherigui, et al.; "FeSi HVOF Thermal Spray Coatings: Diagnostic, Microstructure, and Magnetic Properties"; Materials Letters, North Holland Publishing Company, Amsterdam, NL, vol. 59; No. 4; Feb. 1, 2005; p. 463-467.

International Search Report and Written Opinion of the International Searching Authority; PCT/EP2009/060721; Nov. 30, 2009.

O'Handley; Modern Magnetic Materials—Chapter 7—"Magnetoelastic Effects" pp. 218-273; Copyright (c) 2000 by John Wiley & Sons, Inc.

Fenineche, et al.; "Structure and Magnetic Properties Study of the Iron-Based Thermally Sprayed Alloys" Materials Letter, North Holland, NL; vol. 5; No. 11; Apr. 1, 2004; pp. 1797-1801.

\* cited by examiner

SENSOR FOR MEASURING STRESSES INCLUDING A LAYER OF A MAGNETOELASTIC MATERIAL AND A METHOD FOR PRODUCING THE LAYER

CROSS-REFERENCE TO RELATED APPLICATIONS

The present application is a continuation of pending International Patent Application PCT/EP2009/060721 filed on Aug. 19, 2009 which designates the United States and claims priority from European Patent Application No. 08165077.2 filed on Sep. 25, 2008, the content of which is incorporated herein by reference.

FIELD OF THE INVENTION

The present invention relates to a sensor for measuring stresses induced by a force applied to a load-carrying member, wherein the sensor includes a layer of a magnetoelastic material formed on the load-carrying member, and the sensor is arranged to generate a time-varying magnetic field in the magnetoelastic layer, to detect changes in the permeability in the layer, and to determine the induced stresses based on the detected changes in the permeability in the layer. The present invention relates to a method for producing such a layer.

BACKGROUND OF THE INVENTION

The sensor measures stresses and/or strain in the layer induced by the force applied to the load-carrying member. The force applied to the load-carrying member is, for example, a tensile force, a compressive force, or a torque, and the load-carrying member is, for example, a metallic shaft. Torque sensors of the type described above are well known in the art, for example, from EP0309979. The purpose of the load-carrying member is to transfer load to the stress-measuring layer.

A magnetoelastic, also denoted magnetostrictive, material, is a material that changes its permeability when it is loaded by a force. Examples of magnetoelastic materials are iron, nickel, cobalt and rare earth metals or alloys thereof.

A hard magnetic material stays magnetized when it has been exposed to a strong magnetic field. A soft magnetic material can not stay magnetized after it has been exposed to a strong magnetic field. A soft magnetic material differs from a hard magnetic material in that it cannot maintain a static magnetic field after it has been magnetized. A hard magnetic material typically has a coercive force over several thousand A/m. A soft magnetic material has a considerably lower coercive force, typically less than 1000 A/m.

There is a desire to be able to measure mechanical stresses in a large load range. For example, in the car industry there is a desire to measure torque-induced shear stresses of a magnitude up to 200-300 MPa. Further, there is a desire to find a torque-measuring device that is long-time stable due to resistance against mechanical and thermal fatigue and is linear, i.e. the output signal from the measuring device is essentially proportional to the load on the load-carrying member. Further, there is a desire to reduce or even eliminate creeping in the output signal from the measuring device, i.e. the output signal should not change its value at a constant load. Hysteresis in the output signal should be avoided as it increases the measurement errors. A dense layer and a good adhesion between the layer and the load-carrying member are prerequisites for achieving a measuring device that is long-time stable, has a large load range, and low hysteresis.

Magnetoelastic effect is explained in terms of magnetic domain wall movement (see for example Modern Magnetic Materials by Robert C. O'Handley Chapter 7 ISBN 0-471-15566-7), thus shape and size of magnetic domains and mobility of magnetic domain walls is of essential importance while building sensors based on the magnetoelastic effect.

Magnetic domains, areas with uniform magnetization direction, have boundaries defined as magnetic domain walls. Magnetic domain walls can move in the magnetoelastic material depending upon the magnetization direction of the material. The walls can move freely in the homogeneous single crystal material where it does not experience any obstacles since single crystal is structurally and chemically homogenous. In amorphous material magnetic domain walls do not experience any obstacles since structural or chemical variations are much smaller than domain wall thickness in such materials. Typically, magnetic domain wall thickness in the soft magnetic materials (for example NiFe or FeCo) is of the order of several hundreds of nanometers, in extreme cases up to 1 µm, hence grain sizes less than 100 nm cannot form an effective obstacle for domain wall. Magnetic domain shape and size in such materials depends on demagnetizing field and shape of the magnetized object trying to minimize energy of the magnetized system.

WO2007/106024 discloses a method for producing a layer on a load-carrying member, which layer is intended for measuring stresses induced by a force applied to the load-carrying member, wherein the method comprises: forming a nanocrystalline layer of a magnetoelastic alloy having an average grain size less than 50 nm on a surface of the member, and heat-treating the layer until a crystallization of the alloy occurs and the average grain size becomes in the range of 100 nm to 10 000 nm. This method drastically improves the stress-measuring properties of the layer, due to the fact that the method produces a layer of a microstructure with a grain size large enough to accommodate one or just a few magnetic domains. A nanocrystalline layer having an average grain size less than 50 nm provides favorable conditions for crystallization and tailoring the mentioned microstructure. Microstructures with grains larger than 10000 nm tend to have higher magnetoelastic sensitivity, which is not favorable when trying to achieve the above-mentioned wide measuring range.

The layer is preferably formed on the member by means of electroplating since electroplating is a suitable method in order to achieve a nanocrystalline layer of the desired grain size. The document mentions that it is also possible to use other methods such as PVD (Physical Vapour Deposition) methods, CVD (Chemical Vapour Deposition) methods, and metal spraying, for applying the layer on the load carrying member. However, there are some disadvantages with the electroplating method. One disadvantage is that it takes a very long time to apply thick layers. The above mentioned layer on a load-carrying member is suitably thicker than 30 µm, and preferably between 100 µm and 300 µm. To apply such a thick layer with electroplating takes hours. Accordingly, electroplating is not a commercially attractive method for applying the layer on the load-carrying member. A further disadvantage with electroplating is that it can lead to a reduced strength of the material on which the layer is applied, and in particular for hardened materials, such as carburized steel.

It is important that the application of the layer is fast and easy, hence economically feasible. Layer application with atom-by-atom methods, such as physical or chemical vapour deposition, are slow and have limitations when building layers tens or hundreds of microns thick. A powder metallurgical method, such as thermal spraying, laser cladding, and sintering, has an advantage of being extremely fast in building up the layer thickness and does not impair the strength of the load carrying layer.

High velocity thermal spray techniques are coating processes in which a powder formed of particles is sprayed onto a surface. The powder can be heated before applying. The powder is typically fed into a spray gun, where it may be heated while being accelerated towards the material to be coated. As the sprayed particles impinge upon the surface, they cool and build up a structure forming the coating. The distinct feature of the powder metallurgical methods, while forming metallic layers, is the inhomogenity of the produced coating due to particles that remain fully or partly melted in the coating. Commonly, the surfaces of the particles in the powder are covered with an outer layer of another material, most often oxide of the metal. The outer layers of the particles are included in the coating and thereby contribute to the inhomogenity of the produced coating. A well-known problem with many powder metallurgical methods is oxidation due to the heating of the powder and the fact that the metal powder is in contact with air during the spraying.

Due to the inhomogenity of the produced coating and relatively high temperatures upon deposition of the layer, high speed thermal spray techniques are not suitable to achieve a homogeneous nanocrystalline layer of a desired uniformity of chemical composition and grain sizes. Thus, high velocity thermal spray techniques cannot be used to produce the homogeneous nanocrystalline layer needed for carrying out the method described in WO2007/106024.

U.S. Pat. No. 6,465,039 discloses a method for forming a magnetostrictive composite coating on a shaft. A powder mix of magnetostrictive rare-earth-iron compound ($REF_2$) particles and matrix metal particles carried in a spray gas stream are applied on the shaft by means of low temperature, high velocity spraying. The temperature of the gas may vary between 300-1000° C. The matrix metal particle are sprayed in particle size ranges from 63 to 90 μm and magnetostrictive rare earth iron particles are sprayed in particle sizes between 63 to 106 μm for shafts. The coating itself includes hard magnetized material, thereby generating and maintaining a static magnetic field in the coating. The shaft with the coating is used in a sensor for measuring torques applied to the shaft. The static magnetic field is redirected in dependence on the torque applied to the shaft, due to changes in the permeability of the coating.

For the successful operation of the magnetoelastic sensor described in U.S. Pat. No. 6,465,039, it is required to have magnetically hard materials with a coercive force over several thousands or even tens of thousands of A/m, which is not necessary to have in the case of the magnetoelastic sensor working on the principle of a time-varying magnetic in the layer inducing a voltage in a measuring device in order to detect changes in the permeability.

SUMMARY OF THE INVENTION

The object of the present invention is to provide a method for producing a layer of a magnetoelastic material having good stress-measuring properties, which method overcomes the above mentioned disadvantages with electroplating.

This object is achieved by a method for producing a layer (3) of a magnetoelastic material formed on a load-carrying member (1), which layer is intended for measuring stresses induced by a force applied to the load-carrying member by generating a time-varying magnetic field in the magnetoelastic layer, and detecting changes in the permeability in the layer.

Such a method comprises accelerating particles of a soft magnetic and magnetoelastic material having an average size in the range of 10-50 μm towards the surface of the load-carrying member at a velocity above 300 m/s, such that the average temperature of the accelerated particles is not higher than 500° C. above the melting temperature of the magnetoelastic material, but not lower than 500° C. below the melting temperature of the magnetoelastic material.

The inventors has surprisingly discovered that such a method achieves a layer with equally good, or even better stress measuring properties than the method described in WO2007/106024. An advantage with this method is that it is very fast, and accordingly economically feasible, and it does not impair the strength of the load-carrying member. Due to the relatively low temperature and the high velocity of the particles, the level of oxidation in the layer is kept low, and accordingly low hysteresis in the output signal from the sensor is achieved. Further, the high velocity of the particles also provides for a good adhesion between the layer and the load-carrying member.

The average temperature of the particles should not be lower than 500° C. below the melting temperature, preferably not lower than 200° C. below the melting temperature, and more preferably not lower than 100° C. below the melting temperature. The average temperature of the particles should not be higher than 500° C. above the melting temperature, preferably not higher than 200° C. above the melting temperature, and more preferably not higher than 100° C. above the melting temperature. As the average temperature of the particles is around the melting temperature of the particles, most of the particles will be at least partially melted and deformed when they are applied to the surface of the load-carrying member. This leads to a large number of regions being formed in the layer, each region being enclosed by a material having distinctly different chemical or structural properties, thereby forming a domain wall between the regions when a magnetic field is present. The material in the region and the surrounding material may differ in chemical composition, crystal direction and/or grain size. The size, velocity, and temperature of the accelerated particles strongly influence the size of the regions. It has been proven by tests that accelerating particles having an average size in the range of 10-50 μm and a temperature close to the melting temperature of the magnetoelastic material achieve regions having an average size in the range of 100 nm 10 000 nm. A region of this size forms one or a few magnetic domains. Such a microstructure has been proven to provide favorable stress-measuring properties. Hence, the average grains size of the layer can be above as well as below 100 nm, and still the favorable stress-measuring properties can be achieved. Further, an average temperature of the particles close to the melting temperature of the particles provides dense layers, which have a good adhesion.

To achieve the desired strength and density of the layer, and a good adhesion to the shaft is an advantage if at least some of the particles are melted. The melting temperature of magnetoelastic materials is typically about 1500° C. A gas temperature around 1800° C. achieves a particle temperature around the melting point of the magnetoelastic material, and accordingly partially melted particles. To achieve a temperature close to the melting temperature, it is suitable to accelerate the particles by means of a gas having a temperature in the range of 1500-1900° C.

Since the magnetoelastic material powder particle spends just milliseconds or less in the hot gas stream it does not have time to attain the equilibrium temperature upon impinging on the substrate, i.e. the surface of the particle which is in direct contact with the gas will attain a higher temperature than the centre of the particle. That is the case for larger particles. Dust particles most often are going to melt and become oxidized during the transport through the hot gas stream. These vastly different temperature conditions have a large influence upon oxidation of the particles and their final crystallite size when the layer is formed. There is an obvious ambition, when producing metallic layers, to reduce oxidation, which, in the case of magnetoelastic sensors, results in lower hysteresis of the sensor. The larger powder particles will result in a very low oxidation level in line with the argumentation presented above, but instead both adhesion of the particles and cohesion between the particles will be impaired. With a method according to the invention, it is possible to achieve a plurality of magnetoelastic regions with oxygen levels below 1 wt %.

The completely melted particles are prone to oxidation and upon impinging on the substrate they quench in the nanocrystalline structure with average crystallite sizes below 100 nm. The oxygen content in the melted particles is dependent on the temperature of the carrier gas and supply of oxygen in the gas. With a method according to the invention, a low oxidation of the melted particles is advantageously achieved.

On the other hand, not melted particles often tend be warm enough to recrystallize during the transport towards the substrate and impinge on the substrate in the solid state, which causes the crystallite size to be rather large in a range of thousands of nanometers. Every metal spray deposition method has an optimum particle size which allows achieving a desirable level of melting, hence crystallite size, and dense layers with good adhesion.

Commercially available powder contains particles of different sizes within certain ranges. Hence, the layer becomes inhomogeneous with respect to crystal size, which surprisingly gives an additional parameter that helps to break down the layer into regions of several hundred nanometers in diameter of the magnetoelastic material and gives a desirable magnetic domain size and allows tailoring force sensor characteristics of the magnetoelastic layer.

A structural feature such as metal grain boundaries, oxide layers or regions and layers with different chemical composition defines a magnetic domain boundary, and if these features are separated at least by 100 nm apart they can effectively form the obstacle for the magnetic domain wall and provide pinning for the magnetic domain walls. Magnetic domains being in the range above 100 nm and pinned by these structural and chemical defects in the layer provide desirable magnetoelastic sensor properties, such as relatively low magnetic permeability and magnetoelastic sensitivity.

Surprisingly, with a method according to the invention, a desired relatively low level of magnetic permeability and magnetoelastic sensitivity is achieved without any further processing, such as heating.

Preferably, the particles of a magnetoelastic material have an average size in the range of 10-30 µm. Thereby, it is assured that as many as possible of the regions have an average size in the range of 100 nm 10 000 nm, but most preferably in the range of 100 nm 1000 nm. This embodiment also provides layers that are denser, and which have a better adhesion.

Preferably, the particles are applied to the load-carrying member by means of a high-velocity thermal spray method, for example by means of High Velocity Air Fuel (HVAF). HVAF provides particle temperature and velocity within the desired range, a low oxygen level of the regions and a dense coating with good cohesion.

Another object of the present invention is to provide a sensor with a magnetoelastic layer having good stress-measuring properties, which layer is possible to form on a load-carrying member with a method that overcomes the above mentioned disadvantages with electroplating.

This object is achieved by a sensor for measuring stresses induced by a force applied to a load-carrying member (1), wherein the sensor includes a layer (3) of a magnetoelastic material formed on the load-carrying member, and the sensor is arranged to generate a time-varying magnetic field in the magnetoelastic layer, to detect changes in the permeability in the layer, and to determine the stresses based on the detected changes in the permeability in the layer.

Such a sensor is characterized in that said layer is inhomogeneous and comprises a first phase with an average grain size below 100 nm and a first chemical composition, and a second phase of a distinctly different chemical composition, the first phase is divided by the second phase into regions having an average size in the range of 100-10 000 nm, and a plurality of the regions have an oxygen level less than 1 wt %.

The first and second phases are made of melted powder particles. The first and second phases have distinctly different chemical compositions, and the second phase divides the first phase into a plurality of regions which accordingly form magnetic domains in the presence of a magnetic field. Due to its distinctly different chemical composition, the second phase defines magnetic domain walls around the regions. A microstructure with regions being in the range above 100 nm, but below 10 000 nm, provides desirable magnetoelastic sensor properties, such as relatively low magnetic permeability and magnetoelastic sensitivity. A sensor according to the invention has a large load range, low hysteresis, and low sensitivity in order to achieve linear sensors. The average grain size of the inhomogeneous layer is no longer important for achieving the desired stress measuring properties, as in the prior art. What is important is the average size of the regions.

An oxygen level less than 1 wt % in the regions assures low hysteresis in the output signal from the sensor. By oxygen level is meant the amount of oxygen in the phase. There may exist regions with an oxygen level of more than 1 wt %. However, the main part of the regions should have an oxygen level of less than 1 wt % in order to achieve the desired stress-measuring properties. Preferably, at least 50 wt % of the magnetoelastic material in the layer has an oxygen level less than 1 wt % in order to achieve low hysteresis and desirable low sensitivity.

One alternative to achieve desired regions and domain wall pinning is to provide regions having a first chemical composition, which are enclosed by a material of a second chemical composition that differs from the first composition. The boundary line between the area with the first composition and the surrounding area with the second composition forms a domain wall. For example, the oxygen level of the first chemical composition is less than 1 wt %, and the oxygen level of the second chemical composition is above 5 wt %. Due to the heating of the powder and the fact that the metal powder is in contact with air during the spraying the surfaces of the particles will be coated with a layer of oxide. When the partially melted particles hit the load-carrying member, the particle are partially deformed but not totally destroyed. The remains of the oxide coating will form boundaries that can be magnetic domain walls around the regions, hence providing suitable size magnetic domains for magnetoelastic sensor. According to this embodiment, the second phase is made of metal oxide. Alternatively, the second phase can be made of nitrides carbides or flourides. Pure metals or metalloids also can form the second phase.

Another alternative to achieve the desired regions boundaries, hence magnetic domain wall pinning site, i.e. an obstacle for the magnetic domain wall, is to provide regions having an average grain size in the range of 100 nm-10 000 nm, which are enclosed by a material having an average grain size less than 100 nm. The boundary line between the area with a larger grain size and the surrounding area with a smaller grain size forms an obstacle to a magnetic domain wall. The areas with the smaller grain size are made of melted powder particles. The areas with a larger grain size are made of non-melted powder particles. Such a layer is, for example, produced by using a powder containing particles of different sizes, and containing a fraction of particles with a smaller size, which are melted during the spraying and thereby forming the material having an average grain size less than 100 nm.

According to an embodiment of the invention, the layer comprises a third phase having an average grain size above 100 nm, the third phase consists of a plurality of particles enclosed by the first and second phase, and each particle comprises one or more regions having an average size in the range of 100-10 000 nm and an oxygen level less than 1 wt %, and each region is enclosed by a material having distinctly different structural properties. The third phase is made of non melted particles surrounded by melted particles. The powder particles include one or more grains having an average grain size in the range of 100-10 000 nm. The grains have different crystal directions. The boundary line between the grains defines a magnetic domain wall. Further, the boundary line between the first and third phases also forms a magnetic domain walls due the distinctly different grain size. Accordingly, the grains form magnetic domains in the presence of a magnetic field.

Preferably, the first and second phases amount to 10-90 wt % of the layer, and more preferably to 20-80 wy % of the layer. Most favorable stress measuring properties are achieved when the percentage by weight of the first and third phases is about the same.

Suitably, the magnetoelastic layer has been formed on the surface of the member by thermal spraying of a powder including material particles having an average size in the range of 10-50 μm, and said first and second phases are made of melted or partially melted material particles. Thermal spraying builds up a layer thickness very fast and does not impair the strength of the load-carrying member.

According to an embodiment of the invention, the magnetoelastic material comprises at least 60 at % of a metal or metal alloy consisting of one or more constituents selected from a group consisting of iron, nickel and cobalt. A suitable alloy, which has been proven to give a layer with excellent properties is an alloy including iron in the range of 23-65 wt %, preferably 25-50 wt %, and most preferably 30-45 wt % and nickel in the range of 35-77 wt %, preferably 50-75 wt %, and most preferably 55-70 wt %.

A sensor according to the invention may, for example, be used to measure forces or torques in, but not limited to, engines, cars, airplanes, jet engines, bicycles, gear boxes, power steering in cars, tools, propeller engines or helicopters. A sensor according to the invention is particularly useful for measuring torque in a vehicle.

BRIEF DESCRIPTION OF THE DRAWINGS

The invention will now be explained more closely by the description of different embodiments of the invention and with reference to the appended figures.

DETAILED DESCRIPTION OF THE INVENTION

Figure 1:
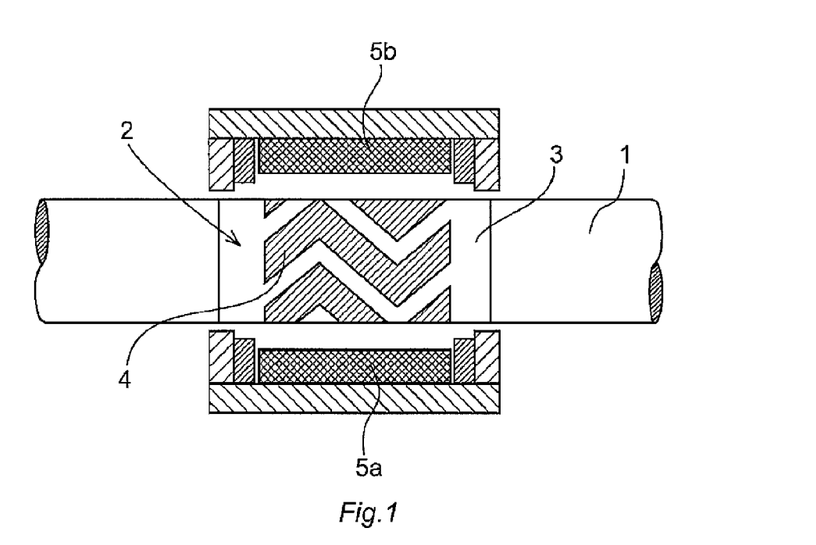
FIG. 1 shows an example of a measuring device including a load-carrying member covered with a magnetoelastic layer.

FIG. 1 shows an example of a measuring device including a load-carrying member, in the form of a rotary shaft 1, which is arranged to transmit a torque in any kind of mechanical transmission. The device is adapted to measure torques applied to the load-carrying member. The load-carrying member is made of a material with sufficient stiffness, for example of steel. A magnetoelastic region 2 is provided on the shaft 1. The magnetoelastic region 2 comprises a first layer 3 of a magnetoelastic material, which has a substantially continuous extension and thickness in said region 2. In this embodiment, the magnetoelastic layer 3 is formed by spraying and is mainly composed of iron and nickel. A second layer 4 in the form of a continuous strip is provided on the first layer 3. The second layer 4 forms a surface pattern on the first layer 3. Further, the measuring device includes windings 5a-b supplying the measuring device with an alternating magnetization field. This type of measuring device is, for example, described in more details in the international patent application WO01/44770. The present invention relates to the first magnetoelastic layer 3 and to a method for producing such a layer.

It has been proven by experiments that an alloy including iron, nickel and other alloying elements within certain ranges achieves good stress-measuring properties. The magnetoelastic layer is, for example, composed of approximately 50 wt % of iron, approximately 50 wt % of nickel and less than 1 wt % of other alloying elements. However, although not yet tested, it is most probable that other combinations of alloying elements in certain ratios would achieve the same result using the method according to the invention. The man skilled in the art may by due practice find out if the method works for other alloying elements as well, and within which ranges it works. For example, combinations of iron and cobalt, or nickel and cobalt would probably achieve the same result.

The method according to the invention for producing the layer 3 material comprises accelerating particles of a soft magnetic and magnetoelastic material having an average size in the range of 10-50 μm towards the surface of the load-carrying member 1 at a velocity of at least 300 m/s, such that the average temperature of the accelerated particles is lower than the melting temperature of the particles, but not lower than 500° C. below the melting temperature. The particles do not include any hard magnetic material, only soft magnetic material. There exist several commercially available thermal spraying methods. However, the methods differ in spray particle temperature and velocity. A particularly suitable method to achieve the desired particle temperature and velocity is High Velocity Air Fuel (HVAF). The process of HVAF is, for example, described in an article "Activated Combustion HVAF Coatings for Protection against Wear and High Temperature Corrosion" written by A. Verstak, and V. Baranovski, UniqueCoat Technologies, Ashland, Virginia USA. According to the HVAF process, spray powder particles are heated below their melting point, while accelerated to velocity well above 700 m/s to form dense and non-oxidized deposits with minimal thermal deterioration.

Alternatively, cold spraying, also called kinetic spraying, with preheating the powder can be used to apply the layer on the load-carrying member. High Velocity Oxygen Fuel (HVOF) is a method which may also possibly be used. If HVOF is used it is necessary to reduce the level of oxygen, for example by selecting a powder with a larger particle size, spraying in protective atmosphere or vacuum. Another possibility is to use sintering to apply the layer. Another possibility is to use two or more layers applied with different methods in order to combine the strength of different spraying methods. For example, a first layer is applied with HVOF on the metallic shaft to achieve a layer with good cohesion to the shaft, and then a second layer is applied upon the first layer with cold spraying that provides good stress measuring properties.

In order to achieve the advantageous measuring properties of the present invention, the use of applying methods which introduce carbon or nitrogen into the layer should be avoided, such as laser coating, remelting of the magnetoelastic layer. If the total content of carbon and nitrogen in the regions is above 1 wt % there is a risk that the hysteresis of the sensor becomes too high. The above mentioned spraying methods do not incorporate carbon or nitrogen into the layers magnetoelastic part and accordingly are suitable methods. Accordingly, the total content of carbon and nitrogen in at least some of the regions should be less than 1 wt %. If the method also introduces oxygen in the layer, the total content of carbon, nitrogen and oxygen in at least some of the regions should be less than 1 wt %.

Sprayed metallic layers in a sprayed state contain a lot of defects which can be annealed in order to stabilize magnetoelastic properties of the layers.

In the process of metal spray deposition it is favorable to use hard particles, such as $Al_2O_3$, which have distinctly higher melting point, hence will be moderately (typically 5-10 vol. %) incorporated in the layer. These particles positively affect the adhesion of the layer, thus long-term stability of the sensor, and lower magnetoelastic sensor hysteresis, without significantly affecting other magnetoelastic properties of the sensor.

Figure 2:
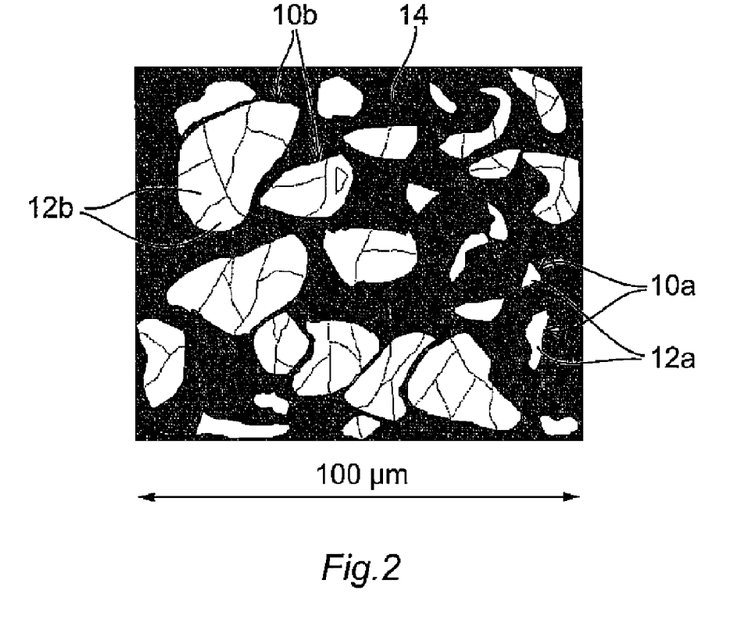
FIG. 2 shows a drawing of a characteristic microstructure of a magnetostrictive layer according to the invention including particles with grains inside and previously melted areas between the particles.

FIG. 2 shows a drawing of a characteristic microstructure of a magnetostrictive layer according to the invention, and produced by the method according to the invention. The layers consist of a heterogeneous magnetoelastic material, such as an iron-nickel alloy, having a melted and a non-melted phase with distinctly different grain sizes. The non-melted phase comprises a plurality of particles 10a-b originating from the powder particles. Each particle contains one or more grains 12a-b. The grains may be enclosed by a layer of oxide. Most of the grains 12a-b have an oxygen level less than 1 wt % and the average size of the grains in the non-melted phase is between 100 nm and 10000 nm. The grains form regions 12a-b of less than 1% oxygen. Each region can form a magnetic domain, i.e. an area which has uniform magnetization direction. For example, each of the particles 10a contains only one grain, which accordingly forms one region 12a. Each of the particles 10b contains a plurality of grains, each grains forming one region 12b. The grains of a particle have different crystal directions and hence structural boundaries are formed between the grains, which function as domain walls between the regions. The particles of the non-melted phase are enclosed by the material 14 of the melted phase. The material of the melted phase has an average grain size less than 100 nm. The material of the melted phase is formed by particles that have melted in the spray process and then solidified. The boundaries between the two phases also form magnetic domain walls.

Figure 3:
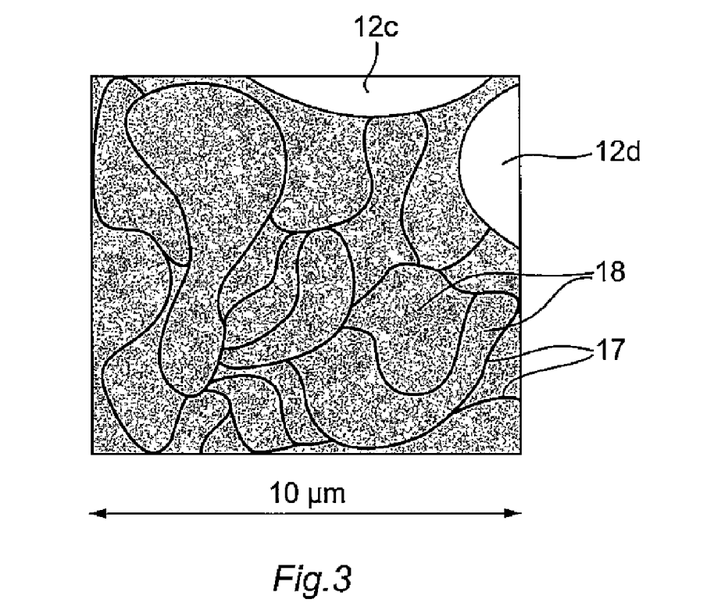
FIG. 3 shows in an enlarged view a previously melted area of a magnetostrictive layer according to the invention.
Figure 4:
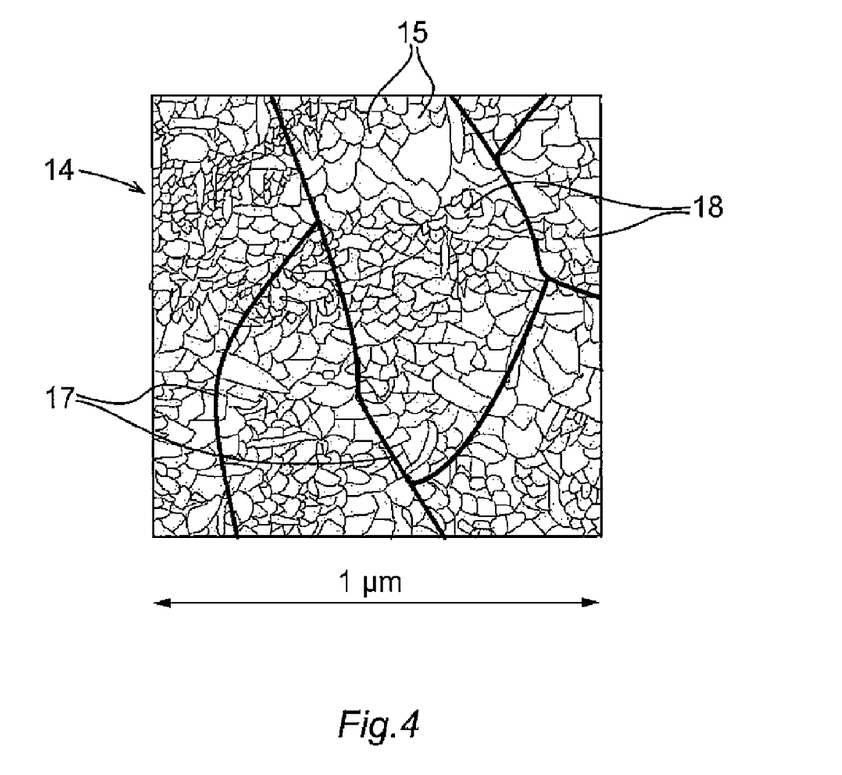
FIG. 4 shows in a further enlarged view the previously melted area of a magnetostrictive layer according to the invention.

FIG. 3 shows the material of the melted phase in an enlargement. FIG. 4 shows the material of the melted phase in a further enlargement. The melted phase is made of material that has melted in the spray process and, as shown in FIG. 4, contains a large number of small grains 15 having an average size that is smaller than 100 nm. Most of the grains have an oxide level less than 1 wt %. The material of the melted phase also contains boundaries 17 of other chemical compositions, normally oxides, surrounding regions 18 of the grains 15. In this example, the boundaries are made of metal oxide and are called the oxide phase. The melted phase 14 is divided by the oxide phase into regions having an average size in the range of 100-10 000 nm. A plurality of the regions has an oxygen level less than 1 wt %. The material of the boundaries 17 may originate from the oxide coating on the particles of the powder. When the particles are melted, the oxide coatings will form boundaries surrounding the regions 18 of small grains 15. In such a case the oxide content in the boundaries is very high, definitely higher than 5 wt %. The melted phase contains a first phase including the regions 18 of small grains and a second phase including the boundaries 17 of a different chemical composition.

Due to the distinctly different composition of the grains 15 and the boundaries 17, the boundaries 17 between the regions 18 form magnetic domain walls and the regions 18 surrounded by the boundaries 17 form magnetic domains. The regions 18 have an average size in the range of 100 nm 10 000 nm. Hence, the melted phase also contains a plurality of regions 18 having an oxygen level less than 1 wt %. Accordingly, the layer shown in FIGS. 2, 3 and 4 have two types of regions, one type 12a-b enclosed by a material having distinctly different structural properties (grain size), and one type enclosed by a material having distinctly different chemical properties (composition). Such a layer is produced by using a powder containing particles of different sizes and with a fraction of small size particles, which are melted during the spraying, or by using a rather high spraying temperature so that a great deal of the particles are melted during the spraying.

Figure 5:
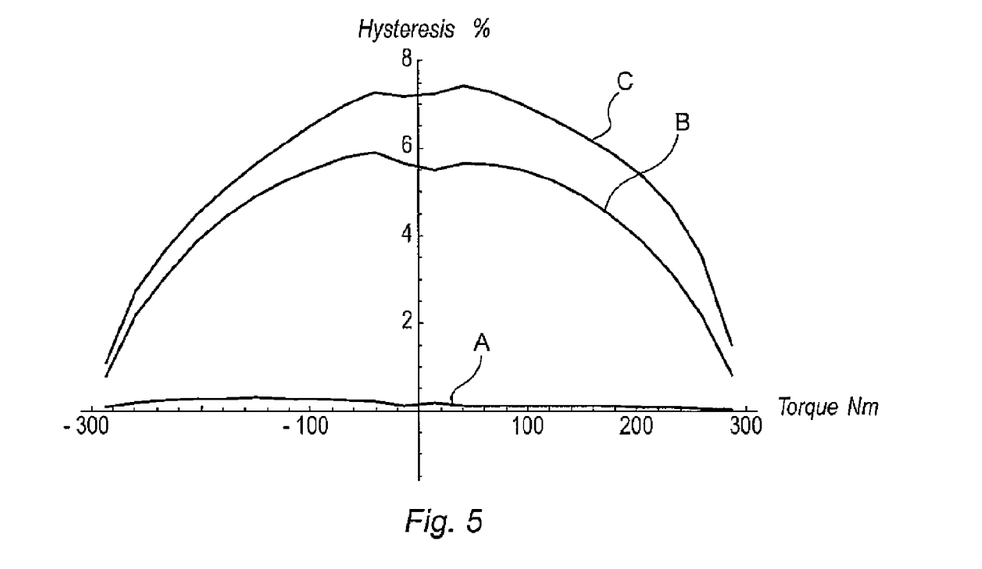
FIG. 5 shows experimental data of the hysteresis as a function of torque for four sensors including a magnetoelastic layer produced by different methods.

FIG. 5 shows three curves A, B, C of the hysteresis of the output signals from four torque sensor as a function of the torque applied to the sensors. Hysteresis in the output signal should be avoided as it increases the measurement errors. Each of the three sensors includes a magnetoelastic layer 3 produced by different methods. The curves are based on experimental data. The hysteresis is expressed in % of full scale for a measuring area +/−300 Nm. Each sensor is produced by a high-velocity spraying method using a powder including particles of an alloy of nickel and iron (50 wt % iron and 50 wt % nickel). The melting temperature of the iron-nickel alloy is about 1500° C.

What mainly differs between the three methods are: the temperature of gas stream carrying the particles during the acceleration, and accordingly the average temperature of the accelerated particles, the velocity of the particles and the size of the particles.

The layer of curve A has been produced by a method according to the invention. The accelerated powder has a particle size of 10-30 μm, a gas temperature of about 1800° C., a particle velocity of 600-900 m/s and an average particle temperature close to the melting temperature of the alloy. This method achieves a layer with a plurality of regions having an oxygen level less than 1 wt % and an average size in the range of 100 nm 10 000 nm. However, there are also areas with a higher level of oxygen, for example, in the boundaries between the regions. As seen from the figure, this method produces a sensor with a low hysteresis, and accordingly with good measuring properties.

The layer of curve B has been produced by a powder having an average particle size larger than 50 μm, a gas temperature of about 1800° C., a particle velocity of 600-900 m/s, and an average particle temperature below the melting temperature of the alloy. This method produces a layer with a large fraction of the non-melted phase, which causes bad density in the layer and bad cohesion to the substrate. As seen from the figure, this method produces a sensor with a high hysteresis, and accordingly with poor measuring properties. Due to the large average size of the particles, bad adhesion to the shaft and a less dense layer is achieved with this method.

The layer of curve C has been produced by a powder having a particle size of 10-30 μm, a gas temperature of about 2800° C., a particle velocity of 300-800 m/s and an average particle temperature highly above the melting temperature of the alloy. Due to the high particle temperature, this method does not produce any regions having an oxygen level less than 1 wt %. The high particle temperature causes all particles to be melted during the spraying. As seen from the figure, this method produces a sensor with a very high hysteresis, and accordingly with very poor measuring properties.

From FIG. 5 it is clear that the method according to the invention produces a sensor with the significantly lowest hysteresis, and accordingly the best measuring properties.

The particle temperature can be measured, for example by means of SprayWatch (Oseir Inc.). The temperature of the particle depends on the gas temperature as well as the size of the particles. If the average size of the particles is too small the particles will be burnt. Bad adhesion of the layer to the shaft will be the result if the average size of the particles is too large and/or if the velocity of the accelerated particles or the temperature of the particles is too low.

The present invention is not limited to the embodiments disclosed but may be varied and modified within the scope of the following claims.

What is claimed is:

1. A sensor for measuring stresses induced by a force applied to a load-carrying member comprising: a layer of a magnetoelastic material formed on the load-carrying member, and the sensor is arranged to generate a time-varying magnetic field in the magnetoelastic layer, to detect changes in the permeability in the layer, and to determine the stresses based on the detected changes in the permeability in the layer, characterized in that said layer is inhomogeneous and comprises a first phase with an average grain size below 100 nm and a first chemical composition, and a second phase of a distinctly different chemical composition, the first phase is divided by the second phase into regions having an average size in the range of 100-10000 nm, and a plurality of the regions have an oxygen level less than 1 wt %.

2. The sensor according to claim 1, wherein the second phase has an oxygen level above 5%.

3. The sensor according to claim 1, wherein said layer comprises a plurality of particles enclosed by the first and second phases, and each particle comprises one or more grains having an average size in the range of 100-10000 nm and an oxygen level less than 1 wt %.

4. The sensor according to claim 1, wherein the first phase amounts to 10-90 wt % of the layer.

5. The sensor according to claim 1, wherein the magnetoelastic layer has been formed on the surface of the member by thermal spraying of a powder including material particles having an average size in the range of 10-50 μm, and said first and second phase are made of melted or partially melted material particles.

6. The sensor according to claim 1, wherein the magnetoelastic material comprises at least 60 wt % of a metal or metal alloy consisting of one or more constituents selected from a group consisting of iron, nickel and cobalt.

7. The sensor according to claim 1, wherein the magnetoelastic material includes iron in the range of 23-65 wt % and nickel in the range of 35-77 wt %.

8. The sensor according to claim 1, wherein at least 50 wt % of the magnetoelastic material in the layer has an oxygen level less than 1 wt %.

9. The sensor according to claim 1, wherein said magnetoelastic material includes iron in the range of 23-65 wt %, preferably 25-50 wt %, and most preferably 30-45 wt % and nickel in the range of 35-77 wt %, preferably 50-75 wt %, and most preferably 55-70 wt %.

10. Use of a sensor according to claim 1 for measuring torque in a vehicle.

* * * * *